(12) United States Patent
Lee et al.

(10) Patent No.: US 9,806,385 B2
(45) Date of Patent: Oct. 31, 2017

(54) SWITCHING BOARD OF NOVEL STRUCTURE, AND BATTERY MODULE CONTAINING THE SAME

(71) Applicant: LG CHEM, LTD., Seoul (KR)

(72) Inventors: Hyun min Lee, Daejeon (KR); Jae Chan Lee, Cheongju-si (KR)

(73) Assignee: LG CHEM, LTD., Seoul (KR)

( * ) Notice: Subject to any disclaimer, the term of this patent is extended or adjusted under 35 U.S.C. 154(b) by 847 days.

(21) Appl. No.: 14/242,188

(22) Filed: Apr. 1, 2014

(65) Prior Publication Data

US 2014/0212711 A1 Jul. 31, 2014

Related U.S. Application Data

(63) Continuation of application No. PCT/KR2012/009816, filed on Nov. 20, 2012.

(30) Foreign Application Priority Data

Dec. 13, 2011 (KR) .................. 10-2011-0133474

(51) Int. Cl.
*H01M 10/637* (2014.01)
*H01M 10/48* (2006.01)
(Continued)

(52) U.S. Cl.
CPC ........... *H01M 10/5026* (2013.01); *B60L 3/12* (2013.01); *B60L 11/187* (2013.01);
(Continued)

(58) Field of Classification Search
CPC . B60L 11/187; H01M 10/425; H01M 10/486; H01M 2/348; H01M 2200/10
See application file for complete search history.

(56) References Cited

U.S. PATENT DOCUMENTS 6,100,466 A 8/2000 Nishimoto
6,203,191 B1 * 3/2001 Mongan .................. G01K 7/42
374/20

(Continued)

FOREIGN PATENT DOCUMENTS

EP 2 293 365 A2 3/2011
EP 2 299 521 A2 3/2011
(Continued)

OTHER PUBLICATIONS

International Search Report for PCT/KR2012/009816 dated Mar. 19, 2013.

*Primary Examiner* — Ula C Ruddock
*Assistant Examiner* — Thomas Parsons
(74) *Attorney, Agent, or Firm* — Birch, Stewart, Kolasch & Birch, LLP

(57) ABSTRACT

Disclosed herein is a switching board having switching elements for temperature measurement mounted on a printed circuit board (PCB) having a circuit electrically connected to a unit cell constituting a battery module, the switching board including an upper board having a pair of switching elements, a temperature detection element, and one or more vertical through holes, the switching elements being electrically connected to the circuit, the temperature detection element and the vertical through holes being disposed between the switching elements, and a lower board having a heating pad at a position corresponding to the vertical through holes and the temperature detection element.

9 Claims, 2 Drawing Sheets

(51) Int. Cl.
*H05K 1/11* (2006.01)
*H01M 2/34* (2006.01)
*H01M 10/42* (2006.01)
*H02J 7/00* (2006.01)
*B60L 3/12* (2006.01)
*B60L 11/18* (2006.01)
*H05K 1/02* (2006.01)

(52) U.S. Cl.
CPC ......... *B60L 11/1879* (2013.01); *H01M 2/348* (2013.01); *H01M 10/425* (2013.01); *H01M 10/486* (2013.01); *H02J 7/0029* (2013.01); *H05K 1/0204* (2013.01); *H05K 1/0209* (2013.01); *H05K 1/115* (2013.01); *B60L 2240/545* (2013.01); *H01M 2200/10* (2013.01); *H01M 2220/20* (2013.01); *H05K 2201/10151* (2013.01); *H05K 2201/10166* (2013.01); *H05K 2201/10416* (2013.01); *Y02T 10/705* (2013.01); *Y02T 10/7011* (2013.01)

(56) References Cited

U.S. PATENT DOCUMENTS

| 7,310,225 B2 * | 12/2007 | Ha .................. H01M 2/1061 361/688 |
|---|---|---|
| 2003/0162084 A1 | 8/2003 | Shigeta et al. |
| 2008/0003484 A1 | 1/2008 | Chen et al. |
| 2011/0083726 A1 | 4/2011 | Takayanagi et al. |
| 2011/0229745 A1 | 9/2011 | Barter et al. |

FOREIGN PATENT DOCUMENTS

| JP | 11-26032 A | 1/1999 |
|---|---|---|
| JP | 2004-22496 A | 1/2004 |
| JP | 2004-37235 A | 2/2004 |
| JP | 2009-117262 A | 5/2009 |
| JP | 2011-185701 A | 9/2011 |
| KR | 2003-0065380 A | 8/2003 |
| TW | 200803024 A | 1/2008 |
| TW | 201007961 A | 2/2010 |

* cited by examiner

[FIG. 1]    Prior Art
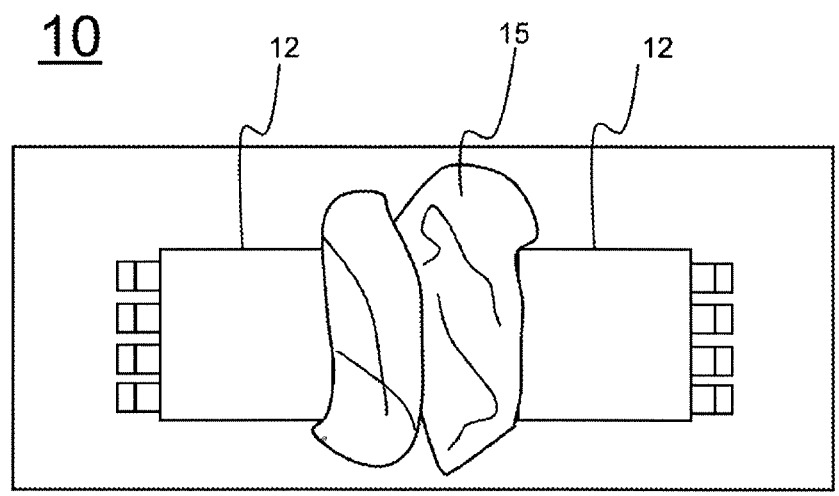
[FIG. 2]
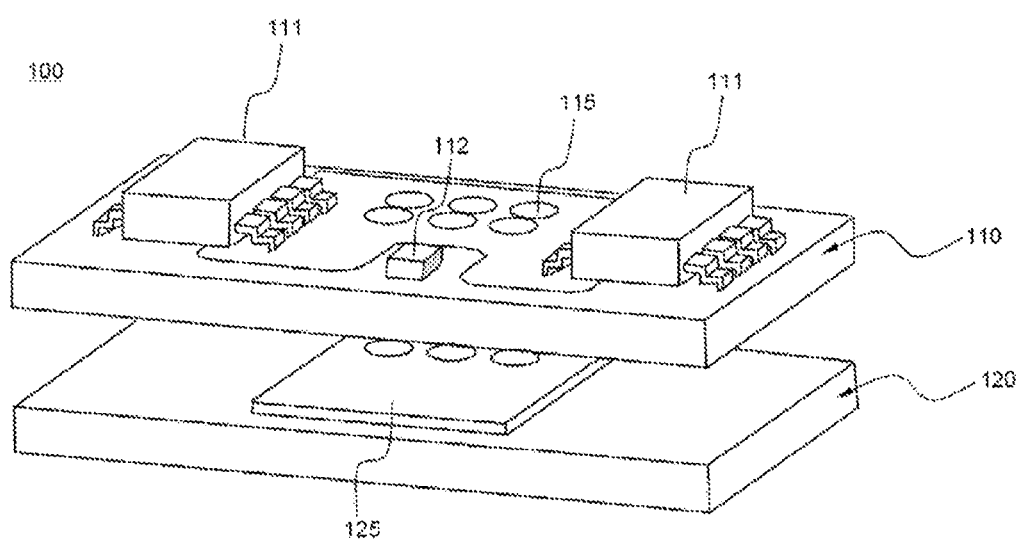

[FIG. 3]
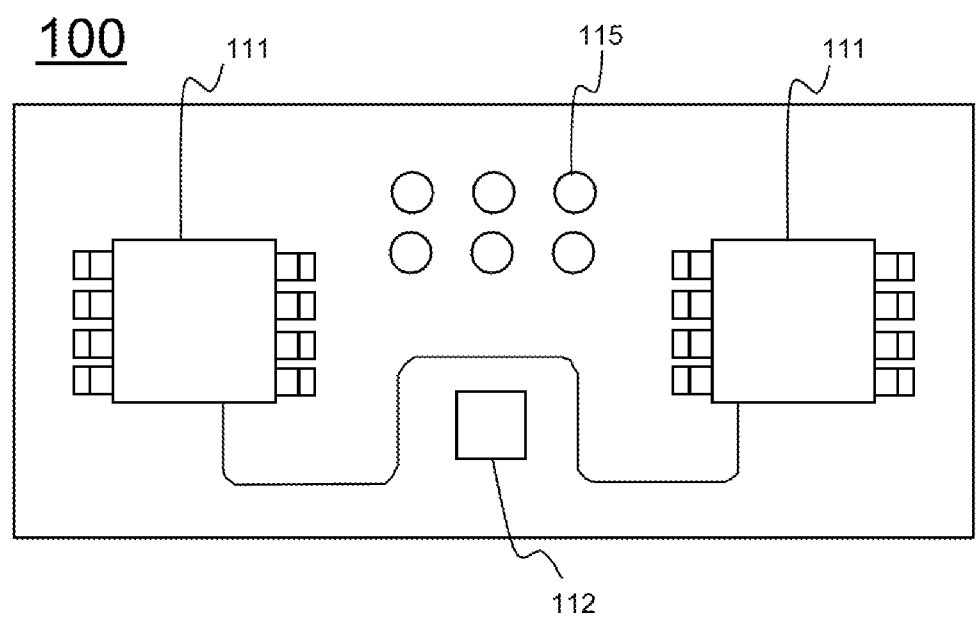

SWITCHING BOARD OF NOVEL STRUCTURE, AND BATTERY MODULE CONTAINING THE SAME

CROSS REFERENCE TO RELATED APPLICATIONS

This non-provisional application is a Continuation of International Application No. PCT/KR2012/009816 filed on Nov. 20, 2012, which claims priority to Korean Patent Application No. 10-2011-0133474 filed in Korea on Dec. 13, 2011. The entire contents of all of the above applications are hereby incorporated by reference.

TECHNICAL FIELD

The present invention relates to a switching board of a novel structure and a battery module including the same, and, more particularly, to a switching board having switching elements for temperature measurement mounted on a printed circuit board (PCB) having a circuit electrically connected to a unit cell constituting a battery module, the switching board including an upper board having a pair of switching elements, a temperature detection element, and one or more vertical through holes, the switching elements being electrically connected to the circuit, the temperature detection element and the vertical through holes being disposed between the switching elements, and a lower board having a heating pad at a position corresponding to the vertical through holes and the temperature detection element.

BACKGROUND ART

As mobile devices have been increasingly developed, and the demand for such mobile devices has increased, the demand for secondary batteries as an energy source for the mobile devices has also sharply increased. Accordingly, much research on secondary batteries satisfying various needs has been carried out.

In terms of the material for batteries, the demand for lithium secondary batteries having high energy density, discharge voltage, and output stability is very high. In terms of the shape of batteries, the demand for prismatic batteries or pouch-shaped batteries, which are thin enough to be applied to products, such as mobile phones, and may be used as batteries for a battery module manufactured by stacking the batteries with high integration is very high.

Although a lithium secondary battery has the above advantages, the lithium secondary battery has a fundamental problem of low safety. For example, if a battery is overcharged, electrolyte decomposition at electrodes of the battery is accelerated with the result that combustible gas is generated from the battery. Also, overcurrent of the battery due to various causes, such as an internal short circuit, increases the temperature of the battery with the result that decomposition of components constituting the battery is caused. The battery may easily catch fire due to such overcharge or overcurrent. According to circumstances, the battery may explode. Also, the increase in temperature of the battery due to causes other than overcurrent may cause the above problems. For this reason, various safety elements to solve the above problems are mounted in the lithium secondary battery.

Specifically, a protection circuit of a secondary battery mainly senses voltage, current, and temperature of the secondary battery to inspect a state of the secondary battery. Generally, the protection circuit senses the temperature of a battery cell and the temperature of a field effect transistor (FET) element and performs a protection function when the sensed temperatures exceed a predetermined temperature.

FIG. 1 is a plan view showing a portion of a conventional switching board 10. Referring to FIG. 1, the switching board 10 includes a pair of switching elements 12 and a temperature detection element (not shown) disposed between the switching elements 12. A thermal glue 15 is applied to the temperature detection element (not shown).

The temperatures of the switching elements 12 are measured through the thermal glue 15. In the above structure, however, measured temperatures may be changed depending upon a heat transfer coefficient of the thermal glue. Also, it may be difficult to accurately measure the temperatures of the switching elements 12 due to a heat dissipation effect of the thermal glue. In addition, manufacturing costs and a defect rate may be increased due to the increase in number of manufacturing processes during manufacture of a battery management unit (BMU).

Therefore, there is a high necessity for a technology that is capable of reducing the manufacturing costs of batteries and, at the same time, accurately measuring the temperatures of the batteries while securing a desired degree of safety.

DISCLOSURE

Technical Problem

Therefore, the present invention has been made to solve the above problem and other technical problems that have yet to be resolved.

It is an object of the present invention to provide a novel switching board including a vertical through hole and a heating pad, thereby preventing measured temperatures of batteries from being changed according to a heat transfer coefficient and reducing a defect rate.

Technical Solution

In accordance with one aspect of the present invention, the above and other objects can be accomplished by the provision of a switching board having switching elements for temperature measurement mounted on a printed circuit board (PCB) having a circuit electrically connected to a unit cell constituting a battery module, the switching board including an upper board having a pair of switching elements, a temperature detection element, and one or more vertical through holes, the switching elements being electrically connected to the circuit, the temperature detection element and the vertical through holes being disposed between the switching elements, and a lower board having a heating pad at a position corresponding to the vertical through holes and the temperature detection element.

In a conventional switching board, a thermal glue is applied to a temperature detection element. As a result, measured temperatures may be changed depending upon a heat transfer coefficient of the thermal glue, and therefore, it is difficult to accurately measure temperatures.

As compared with the conventional switching board, the switching board according to the present invention does not use the thermal glue. Consequently, the switching board according to the present invention is not affected by a heat transfer coefficient of the thermal glue. In addition, it is possible to prevent temperatures of the switching elements from being inaccurately measured due to a heat dissipation effect of the thermal glue.

The switching elements are electrically connected to unit cells constituting a battery module to control current flowing in the unit cells. The switching elements are connected to a protection circuit for detecting voltages and/or currents of the unit cells to control the switching elements.

The switching elements are not particularly restricted so long as the switching elements control overcharge, overdischarge, and overcurrent of the unit cells. For example, field effect transistor (FET) elements or transistors may be used as the switching elements. Preferably, the FET elements are used as the switching elements.

Preferably, the upper board and the lower board are integrated. The upper board and the lower board may be integrated in various manners. For example, the upper board and the lower board may be integrated by thermal welding, bonding, or insert injection molding.

In a preferred example, the heating pad may sense heat generated from the switching elements and transmit the sensed heat to the temperature detection element. That is, the switching board is configured to have a novel structure including the vertical through holes and the heating pad. Consequently, temperatures transmitted through the vertical through holes are transmitted to the temperature detection element through the heating pad, and therefore, accurate temperature measurement is possible.

The heating pad is formed of a metallic material, such as aluminum or an aluminum alloy, exhibiting high thermal conductivity such that the heating pad can more easily transmit heat generated from the switching elements.

In another preferred example, the temperature detection element may be a chip thermistor.

In accordance with another aspect of the present invention, there is provided a battery module including the switching board.

In accordance with a further aspect of the present invention, there is provided a battery pack including the battery module.

The battery pack according to the present invention may be used as a power source of a middle or large-sized device. The middle or large-sized device may be an electric vehicle, a hybrid electric vehicle, a plug-in hybrid electric vehicle, or a power storage system.

The structures and manufacturing methods of the battery pack including the battery module and the middle or large-sized battery pack including the battery module are well known in the art to which the present invention pertains, and therefore, a detailed description thereof will be omitted.

Effects of the Invention

As is apparent from the above description, a switching board according to the present invention includes a vertical through hole and a heating pad. Consequently, it is possible to prevent measured temperatures of batteries from being changed according to a heat transfer coefficient, thereby accurately detecting the temperatures of batteries and reducing a defect rate.

DESCRIPTION OF DRAWINGS

The above and other objects, features and other advantages of the present invention will be more clearly understood from the following detailed description taken in conjunction with the accompanying drawings, in which:

FIG. 1 is a plan view showing a portion of a conventional switching board;

FIG. 2 is an exploded perspective view showing a switching board according to an embodiment of the present invention; and FIG. 3 is a plan view showing a portion of the switching board shown in FIG. 2.

BEST MODE

Now, preferred embodiments of the present invention will be described in detail with reference to the accompanying drawings. It should be noted, however, that the scope of the present invention is not limited by the illustrated embodiments.

FIG. 2 is an exploded perspective view showing a switching board 100 according to an embodiment of the present invention, and FIG. 3 is a plan view showing a portion of the switching board 100 shown in FIG. 2.

Referring to these drawings, the switching board 100 includes an upper board 110 and a lower board 120. At the upper board 110 are formed a pair of field effect transistor (FET) elements 111, a chip thermistor element 112, and one or more vertical through holes 115. The chip thermistor element 112 and the vertical through holes 115 are disposed between the FET elements 111. For the convenience of description, the upper board 110 and the lower board 120 are shown as being separated from each other in FIG. 2. As previously described, however, the upper board 110 and the lower board 120 may be integrated in various manners.

At the lower board 120 is mounted a heating pad 125 formed of a material exhibiting high thermal conductivity such that the heating pad 125 corresponds to the vertical through holes 115 and the chip thermistor element 112.

The heating pad 125 senses heat generated from the FET elements 111 and transmits the sensed heat to the chip thermistor element 112. Consequently, it is possible for the heating pad 125 to accurately measure temperatures of the FET elements 111 without a heat transfer coefficient being affected.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A switching board having switching elements for temperature measurement mounted on a printed circuit board (PCB) having a circuit electrically connected to a unit cell constituting a battery module, the switching board comprising:
    an upper board having a pair of switching elements, a temperature detection element, and one or more vertical through holes, the switching elements being electrically connected to the circuit, the temperature detection element and the vertical through holes being disposed between the switching elements; and
    a lower board having a heating pad at a position corresponding to the vertical through holes and the temperature detection element,
    wherein the heating pad is configured to sense heat generated from the switching elements and to transmit the sensed heat to the temperature detection element.

2. The switching board according to claim 1, wherein the switching elements are field effect transistor (FET) elements and are disposed directly on the upper board.

3. The switching board according to claim 1, wherein the upper board and the lower board are integrated.

4. The switching board according to claim 1, wherein the heating pad is formed of a material exhibiting thermal conductivity.

5. The switching board according to claim 1, wherein the temperature detection element is a chip thermistor.

6. A battery module comprising a switching board according to claim 5.

7. A battery pack comprising a battery module according to claim 6.

8. The battery pack according to claim 7, wherein the battery pack is used as a power source of a device.

9. The battery pack according to claim 8, wherein the device is an electric vehicle, a hybrid electric vehicle, a plug-in hybrid electric vehicle, or a power storage system.

\* \* \* \* \*